United States Patent
Shih et al.

(10) Patent No.: US 9,451,721 B1
(45) Date of Patent: Sep. 20, 2016

(54) MODULAR REDUNDANT POWER SUPPLY

(71) Applicant: ZIPPY TECHNOLOGY CORP., New Taipei (TW)

(72) Inventors: Tsun-Te Shih, New Taipei (TW); Yu-Yuan Chang, New Taipei (TW); Heng-Chia Chang, New Taipei (TW); Chun-Lung Su, New Taipei (TW)

(73) Assignee: ZIPPY TECHNOLOGY CORP., New Taipei (TW)

( * ) Notice: Subject to any disclaimer, the term of this patent is extended or adjusted under 35 U.S.C. 154(b) by 0 days.

(21) Appl. No.: 14/697,026

(22) Filed: Apr. 27, 2015

(51) Int. Cl.
G06F 1/18 (2006.01)
H05K 7/14 (2006.01)
H05K 7/10 (2006.01)

(52) U.S. Cl.
CPC ............ *H05K 7/1457* (2013.01); *G06F 1/188* (2013.01); *H05K 7/10* (2013.01); *H05K 7/1492* (2013.01)

(58) Field of Classification Search
CPC ......... G06F 1/188; G06F 1/189; H05K 7/10; H05K 7/1457; H05K 7/1492
See application file for complete search history.

(56) References Cited

U.S. PATENT DOCUMENTS

| | | | | |
|---|---|---|---|---|
| 5,587,881 A * | 12/1996 | Wang | ...................... | G06F 1/184 361/695 |
| 5,612,854 A * | 3/1997 | Wiscombe | ............. | G06F 1/184 361/679.6 |
| 5,973,947 A * | 10/1999 | Shih | ..................... | H05K 7/1457 363/144 |
| 6,169,661 B1 * | 1/2001 | Lee | ......................... | G06F 1/184 307/150 |
| 6,246,580 B1 * | 6/2001 | Weng | ....................... | G06F 1/18 174/16.1 |
| 6,445,586 B1 * | 9/2002 | Chou | ..................... | G06F 1/182 312/223.1 |
| 6,731,507 B2 * | 5/2004 | Varghese | ................. | G06F 1/18 312/223.2 |
| 6,970,346 B2 * | 11/2005 | Shih | ....................... | G06F 1/181 307/65 |
| 7,382,624 B2 * | 6/2008 | Barsun | ..................... | G06F 1/26 174/50 |
| 7,800,894 B2 * | 9/2010 | Davis | .................. | G11B 33/127 361/679.33 |
| 7,929,286 B2 * | 4/2011 | Lu | ....................... | H05K 7/1457 320/111 |
| 8,264,821 B2 * | 9/2012 | Lu | ........................ | G06F 1/182 361/601 |
| 8,294,298 B2 * | 10/2012 | Yang | ...................... | H02M 7/04 307/64 |
| 8,330,292 B2 * | 12/2012 | Wang | .................. | H02M 1/4208 307/38 |
| 8,611,071 B2 * | 12/2013 | Su | ........................ | G06F 1/189 361/622 |
| 2003/0030977 A1 * | 2/2003 | Garnett | .................. | G06F 1/183 361/679.48 |
| 2003/0030978 A1 * | 2/2003 | Garnett | .................. | G06F 1/183 361/679.48 |
| 2014/0197689 A1 * | 7/2014 | Shih | ........................ | H02J 9/06 307/66 |

FOREIGN PATENT DOCUMENTS

| | | |
|---|---|---|
| TW | I357550 B1 | 2/2012 |
| TW | M459676 U1 | 8/2013 |

* cited by examiner

*Primary Examiner* — Robert J Hoffberg
(74) *Attorney, Agent, or Firm* — Muncy, Geissler, Olds & Lowe, P.C.

(57) ABSTRACT

A modular redundant power supply includes a casing, a power integration panel, a plurality of power supply modules and a power regulation module. The casing has an installation space defined into a first installation zone and a second installation zone. The power integration panel is located in the installation space. The power supply modules are installed on the first installation zone and connected to the power integration panel. Each power supply module outputs a duty power to the power integration panel after being started. The power regulation module gets the duty power from the power integration panel and regulates thereof to generate an auxiliary duty power output to the power integration panel so that the power integration panel can supply the duty power and the auxiliary duty power to an external device.

7 Claims, 4 Drawing Sheets

MODULAR REDUNDANT POWER SUPPLY

FIELD OF THE INVENTION

The present invention relates to a redundant power supply and particularly to a modular redundant power supply.

BACKGROUND OF THE INVENTION

Technology industry at present usually has high demand on power supply stability. To meet this end a redundant power supply has been developed. The redundant power supply mainly includes a primary power supply, a secondary power supply for backup and a power integration panel. When power supply is started the power integration panel receives electric power output from the primary power supply and the secondary power supply to supply to a load. The power integration panel also regulates the received power to generate a voltage required in operation of motherboards.

Moreover, in order to facilitate fast repairs and maintenance of the primary power supply or the secondary power supply the conventional redundant power supply generally has the power integration panel located at a distal end of a casing to make loading and unloading of the primary power supply or the secondary power supply easier, such as those disclosed in Taiwan Patent Nos. 1357550 and M459676. However, in practice during power supply operation of the redundant power supply the power integration panel still has malfunction risk. Due to the conventional power integration panel is located at the distal end of the casing, technicians have to sequentially remove the primary power supply and the secondary power supply from the casing to do repairs and maintenance of the power integration panel. In addition, once the redundant power supply is finished in production the power regulation function of the power integration panel is fixed and cannot be changed according to actual implementation requirements. Hence the problem of power loss could take place.

SUMMARY OF THE INVENTION

The primary object of the present invention is to solve the problems of the conventional redundant power supply of difficulty in repairs and maintenance and unable to do adjustment according to actual implementation requirements. To achieve the foregoing object the present invention provides a modular redundant power supply that includes a casing, a power integration panel, a plurality of power supply modules and a power regulation module. The casing has an installation space with an open side formed an installation opening and an installation distal end at another side opposing the installation opening. The casing has an assembly rack located in the installation space to define a first installation zone and a second installation zone. The power integration panel is located in the installation space corresponding to the installation distal end and includes an integrated circuit which has a plurality of first connection ports and a second connection port, and at least one output port connected to the integrated circuit to supply power to an external device. Each first connection port corresponds to the first installation zone, and the second connection port corresponds to the second installation zone. The power supply modules are installed on the first installation zone and each power supply module is removable against the casing. Each power supply module is connected to an external power source through a power input end to get an external power and transforms the external power to output a duty power to the integrated circuit via a power output end which is connectable to the first connection ports so that the integrated circuit supplies the duty power to the external device through the output port. The power regulation module is located on the assembly rack at the second installation zone and removable against the casing, and has a power connection end connectable to the second connection port to get the duty power from the integrated circuit, and a power regulation unit connected to the power connection end to receive the duty power and do transformation to generate at least one auxiliary duty power. After the power regulation unit has generated the auxiliary duty power, the power connection end outputs the auxiliary duty power to the integrated circuit which supplies the auxiliary duty power via the output port to the external device.

In one embodiment the duty power is 12V, and the auxiliary duty power is 5V or 3.3V.

In another embodiment the power regulation unit can regulate a plurality of the auxiliary power each has a different voltage.

In yet another embodiment the power integration panel gets a start control signal from the external device, and the power regulation module includes a start control unit to get the start control signal from the power integration panel to control start of each power supply module.

In yet another embodiment the casing has a plurality of installation racks that are located in the installation space and spaced from each other for installation of the power supply modules in a removable manner.

In yet another embodiment each power supply module includes the power input end, a rectification filter unit connected to the power input end, a power factor correction unit connected to the rectification filter unit, a transformer connected to the power factor correction unit, a pulse width control unit, a switch element and a power output end connectable to the first connection ports.

In yet another embodiment each power supply module further includes a secondary rectification filter unit connected to an output side of the transformer.

By means of the structure set forth above, compared with the conventional techniques, the invention provides many advantageous features, notably:

1. Through the removable power regulation module the problem of difficulty in repairs and maintenance and replacement that occurred to the conventional power integration panel can be resolved.

2. The power regulation module can be selected according to actual implementation requirements.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
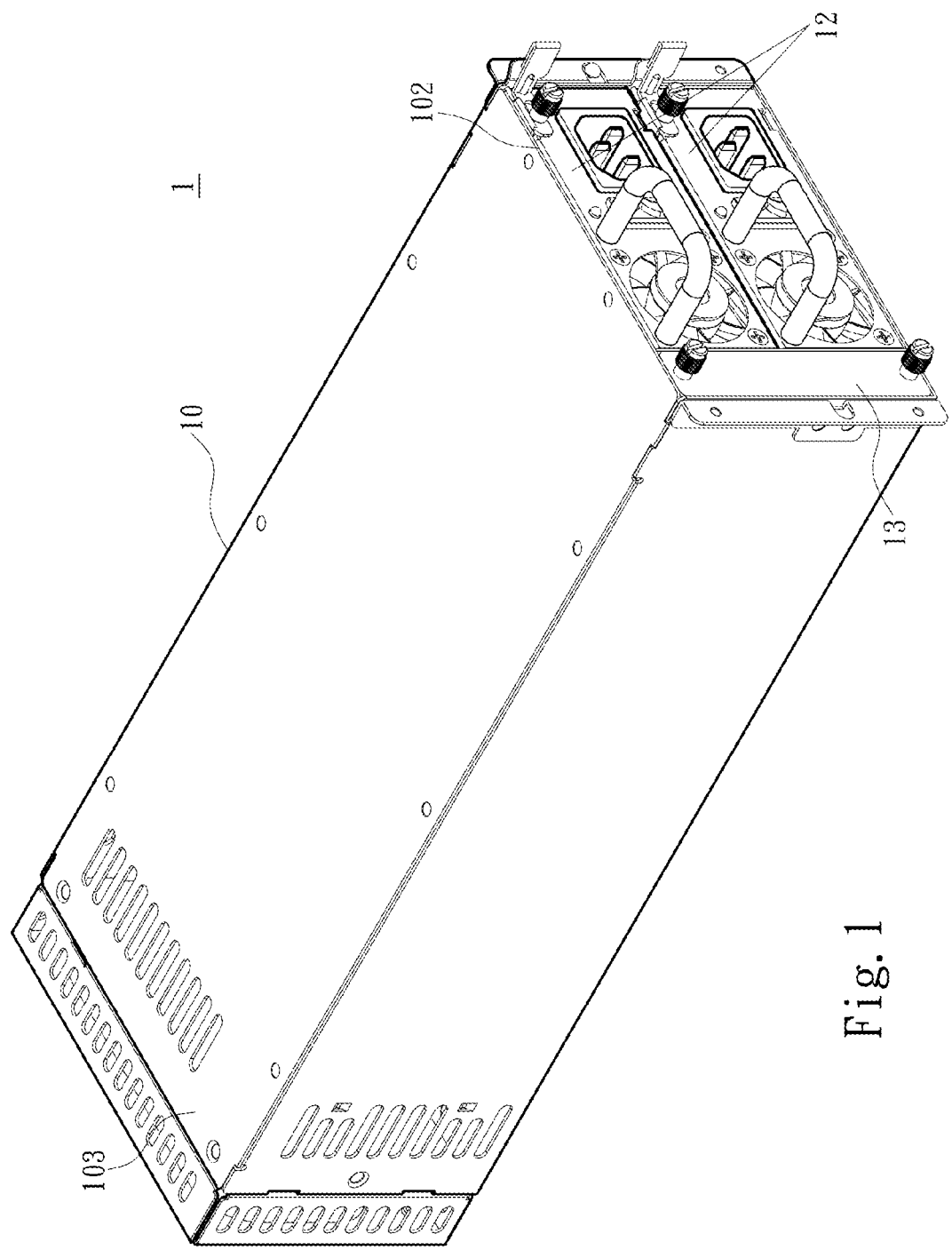
FIG. 1 is a perspective view an embodiment of the invention.

Please referring to FIGS. 1 through 4, the present invention aims to provide a modular redundant power supply that includes a casing 10, a power integration panel 11, a plurality of power supply modules 12 and a power regulation module 13. In one embodiment the casing 10 can be made via mechanical fabrication processes such as stamping a metallic material and the like. The finished casing 10 has an installation space 101 with an open side formed an installation opening 102 and an installation distal end 103 at a closed another side opposing the installation opening 102. The casing 10 also has at least one installation aperture (not shown in the drawings) at the installation distal end 103 for wiring of electronic elements located in the installation space 101 to connect to an external device 2. The casing 10 further has an assembly rack 104 located in installation space 101 to define a first installation zone 105 and a second installation zone 106. In addition, by adjusting the location of the assembly rack 104 in the installation space 101 the spatial size of the first installation zone 105 and the second installation zone 106 can be changed.

The power integration panel 11 is located in the installation space 101 corresponding to the installation distal end 103 and includes an integrated circuit 111 and an output port 112. The integrated circuit 111 includes a plurality of first connection ports 113 and a second connection port 114. The output port 112 is connected to the integrated circuit 111 to supply power to the external device 2 through the installation aperture of the casing 10. Each first connection port 113 corresponds to the first installation zone 105, and the second connection port 114 corresponds to the second installation zone 106. In another embodiment the casing 10 has at least one installation rack 107 located in the installation space 101 for installation of the power supply modules 12.

Please referring to FIGS. 2 through 4 again, the power supply modules 12 are installed on the first installation zone 105, and each power supply module 12 is removable individually against the casing 10. Each power supply module 12 also includes a power input end 121, a rectification filter unit 122 connected to the power input end 121, a power factor correction unit 123 connected to the rectification filter unit 122, a transformer 124 connected to the power factor correction unit 123, a pulse width control unit 125, a switch element 126 and a power output end 127 connectable to the first connection ports 113. In yet another embodiment the power output end 127 can be a plug structure corresponding to the first connection ports 113 in specification to form connection therewith. Each power supply module 12 is connected to an external power source through the power input end 121 to get an external power 3. The external power 3 is transformed via the rectification filter unit 122, the power factor correction unit 123 and the transformer 124 to generate a duty power which is output to the integrated circuit 111 of the power integration panel 11 through the power output end 127 connectable to the first connection ports 113. After the integrated circuit 111 has got the duty power, the duty power is supplied to the external device 2 through the output port 112. In addition, in yet another embodiment each power supply module 12 includes a secondary rectification filter unit 128 connected to an output side of the transformer 24 so that the duty power output from each power supply module 12 can be stabilized.

Figure 2:
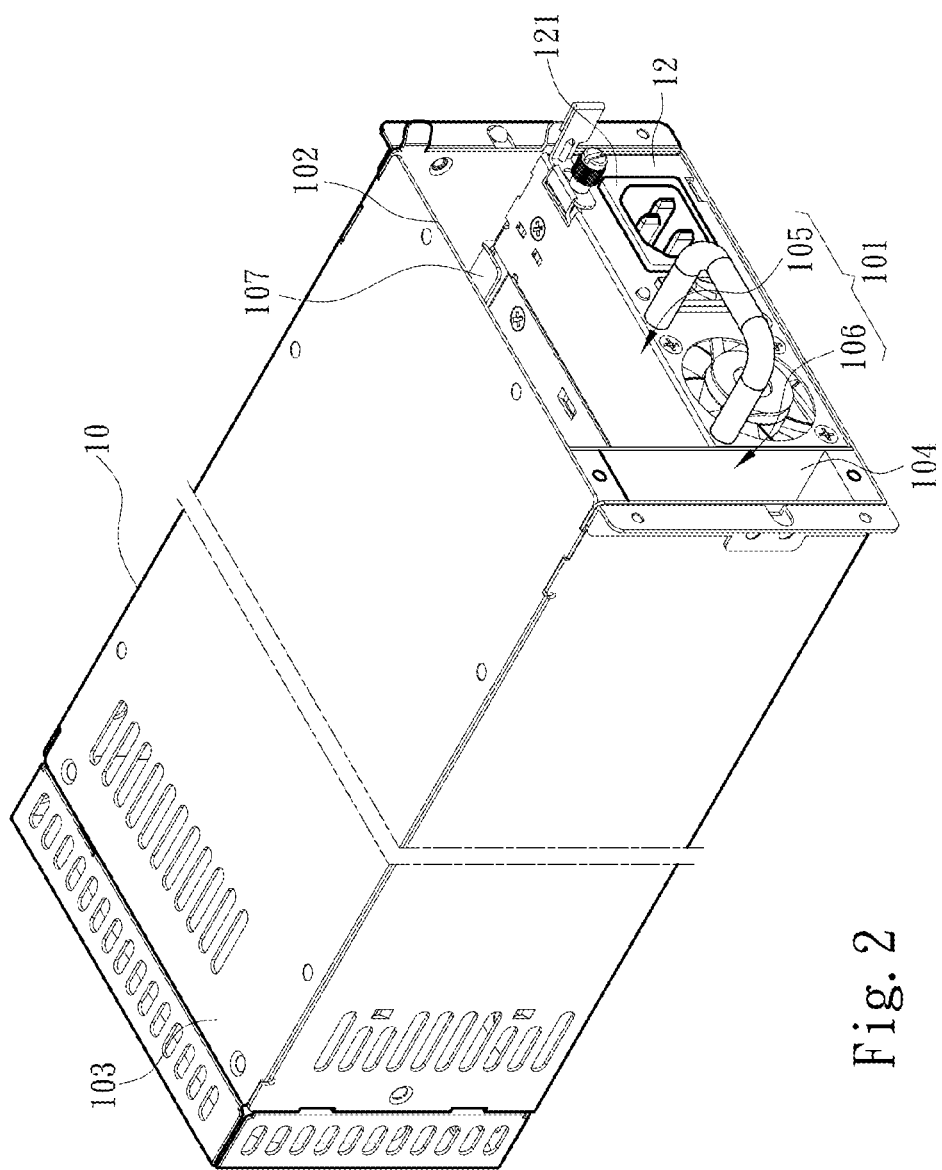
FIG. 2 is an exploded view of an embodiment of the invention.
Figure 3:
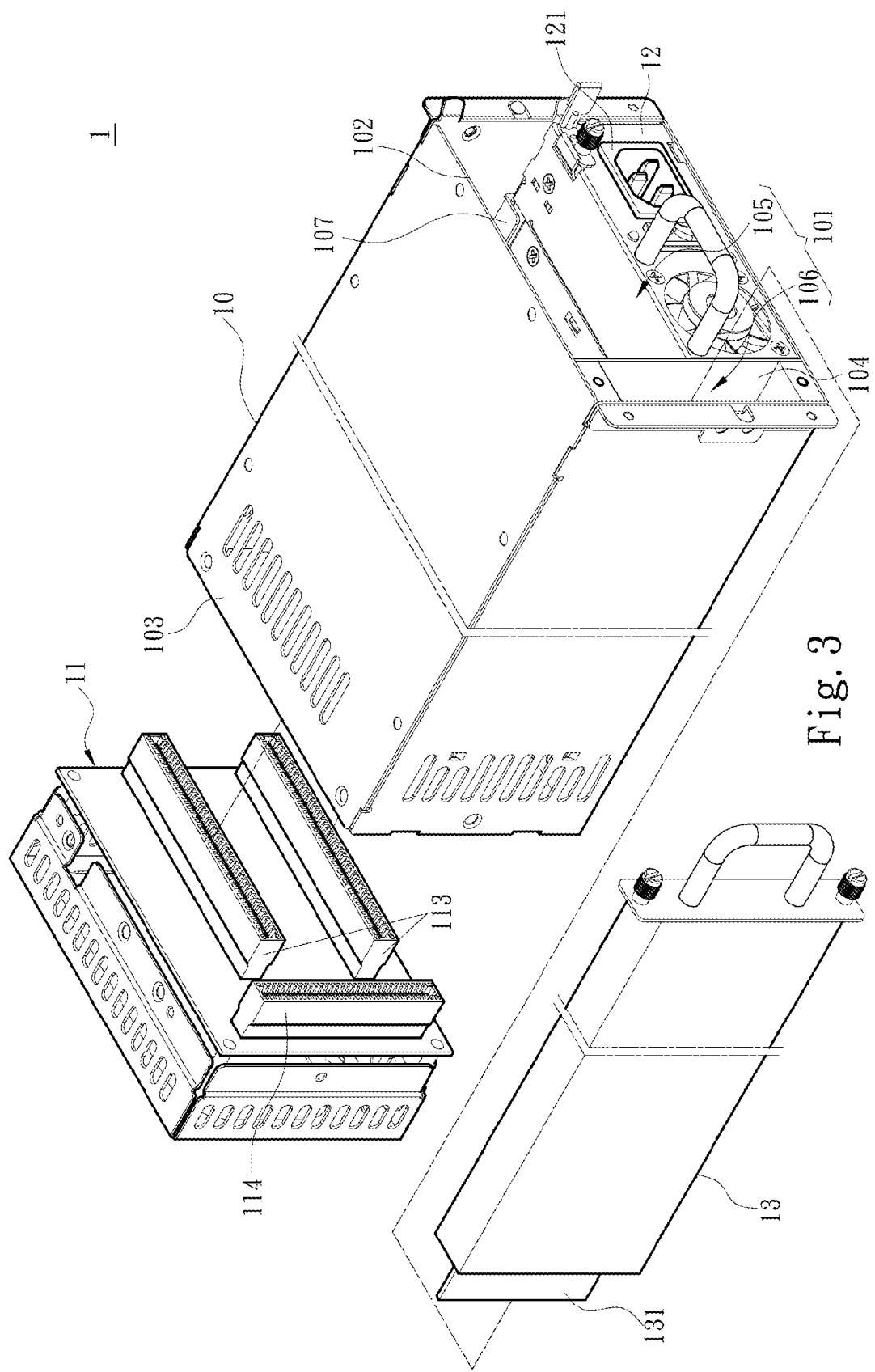
FIG. 3 is another exploded view of an embodiment of the invention.
Figure 4:
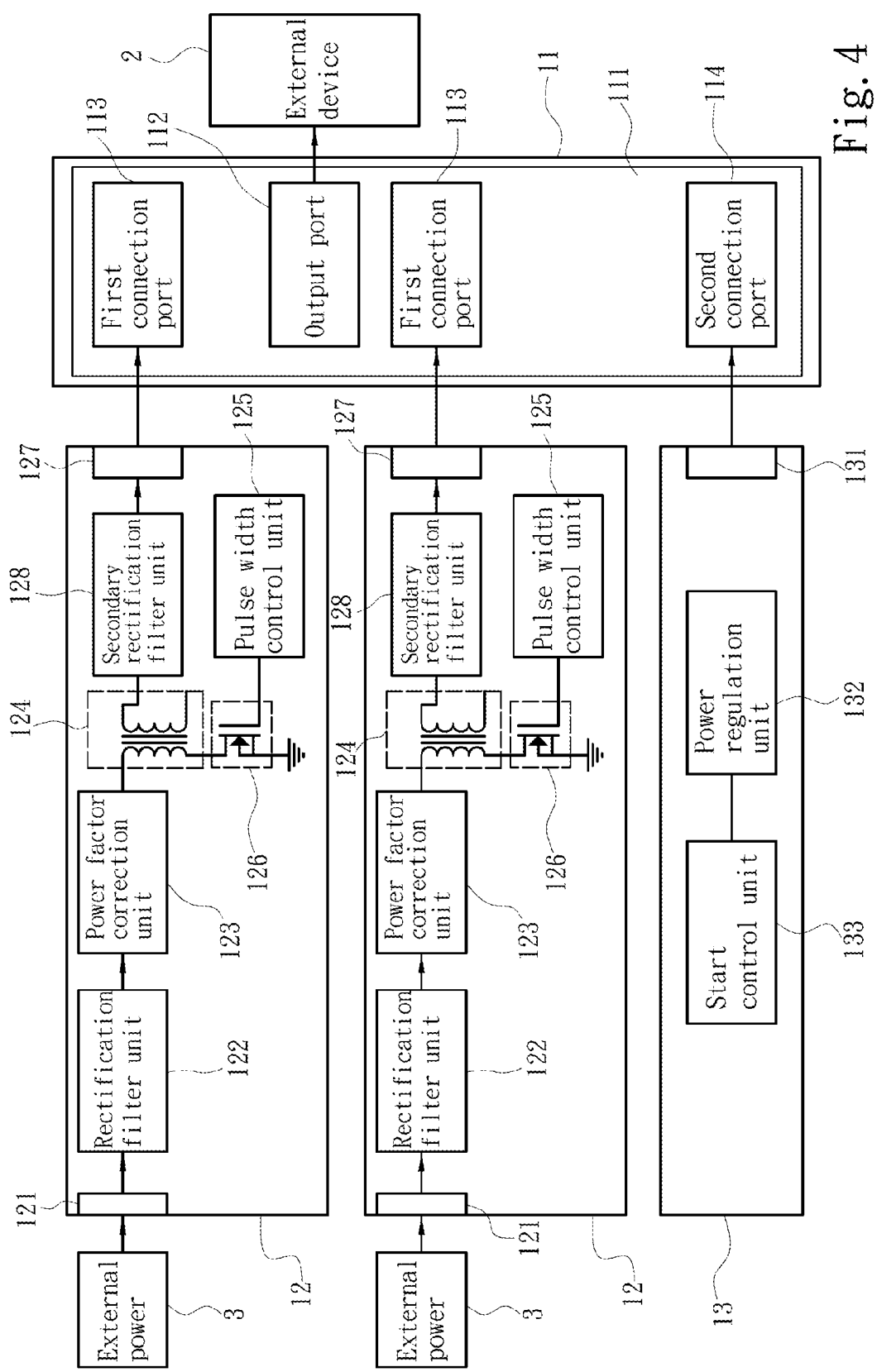
FIG. 4 is a circuit block diagram of the circuit unit of an embodiment of the invention.

Please referring to FIGS. 2 and 4, the power regulation module 13 is installed on the assembly rack 104 in the second installation zone 106 and removable against the casing 10 under user control. In addition, the power regulation module 13 has a power connection end 131 connectable to the second connection port 114 and a power regulation unit 132 connected to the power connection end 131. In yet another embodiment the power connection end 131 can be a plug structure corresponding to the second connection port 114 in specification to form connection therewith. Furthermore, in yet another embodiment the power connection end 131 and the second connection port 114 are divided into a power receiving portion and a power transmission portion. In practice the power receiving portion of the power connection end 131 is connected to the power transmission portion of the second connection port 114, and the power transmission portion of the power connection end 131 is connected to the power receiving portion of the second connection port 114. The power regulation module 13 is connected to the integrated circuit 111 of the power integration panel 11 through the power connection end 131 to get the duty power generated by each power supply module 12, then the power regulation unit 132 regulates the duty power to generate at least one auxiliary duty power which is output to the integrated circuit 111 via the power connection port 131, and the output port 112 of the integrated circuit 111 supplies the auxiliary duty power to the external device 2. The auxiliary duty power can be 5V, 3.3V, −5V or −12V defined in ATX motherboard specifications. In yet another embodiment the power regulation module 13 can regulate a plurality of the auxiliary duty power at the same time each has a different voltage. As previously discussed in yet another embodiment the auxiliary duty power output from the power regulation unit 132 is 5V which can be $5V_{SB}$ defined in an ATX motherboard specification.

Moreover, after each power supply module 12 has got the external power 3, the external power 3 can be transformed to duty power of 12V which is output immediately to the power integration panel 11 which in turn integrates and outputs to the external device 2. On the other hand, in the event that the power regulation module 13 is not connected to the external power 3, but gets the duty power from the power integration panel 11 and regulates the duty power to generate the auxiliary duty power of 5V or 3.3V, the power regulation module 13 can output the auxiliary duty power via the power connection end 131 to the power integration panel 11; then the power integration panel 11 outputs the duty power and the auxiliary duty power to the external device 2 for using thereof. Since each power supply module 12 of the invention needs merely to output the duty power at a specific voltage circuit design of the power supply module 12 can be simplified. In addition, the power regulation module 13 can be designed in a removable fashion to make repairs and maintenance easier, and also can be selected to match requirements when in use. Furthermore, in yet another embodiment the power regulation module 13 includes a start control unit 133 controlled via a start control signal (Ps_on) to control start of each power supply module 12. Therefore, at initial implementation the external device 2 can be triggered to generate the start control signal (Ps_on) which is sent to the modular redundant power supply 1, and the power integration panel 11 gets the start control signal and outputs immediately to the power regulation module 13 to control start of each power supply module 12 through the start control unit 133.

As a conclusion, the modular redundant power supply of the invention includes a casing, a power integration panel, a plurality of power supply modules and a power regulation module. The casing has an installation space which is defined into a first installation zone and a second installation zone. The power integration panel is located in the installation space. The power supply modules are located in the first installation zone and connected to the power integration panel. The power regulation module is located in the second installation zone and connected to the power integration panel. After each power supply module is started it outputs a duty power to the power integration panel. The power regulation module gets the duty power from the power integration panel and regulates to generate an auxiliary duty power output to the power integration panel which in turn supplies the duty power and the auxiliary duty power to an external device. Thus, repairs and maintenance of the modular redundant power supply can be simplified, and the modular design can facilitate selection of the power regulation module according to implementation requirements.

What is claimed is:

1. A modular redundant power supply, comprising:
   a casing including an installation space which has an open side formed as an installation opening and an installation distal end at another side opposing the installation opening, and an assembly rack located in the installation space to define a first installation zone and a second installation zone;
   a power integration panel which is located in the installation space corresponding to the installation distal end and includes an integrated circuit, the power integration panel has a plurality of first connection ports and a second connection port, and at least one output port connected to the integrated circuit to supply power to an external device, each of the first connection ports corresponding to the first installation zone, the second connection port corresponding to the second installation zone;
   a plurality of power supply modules installed in the first installation zone and removable against the casing, each of the power supply modules being connected to an external power source through a power input end to get an external power and transforming the external power to output a duty power to the integrated circuit through a power output end connectable to the first connection ports so that the integrated circuit supplies the duty power to the external device through the output port; and
   a power regulation module which is located on the assembly rack in the second installation zone and removable against the casing and includes a power connection end connectable to the second connection port to get the duty power from the integrated circuit and a power regulation unit connected to the power connection end to get and regulate the duty power to generate at least one auxiliary duty power;
   wherein the auxiliary duty power generated by the power regulation unit is sent to the integrated circuit through the power connection end and supplied by the integrated circuit to the external device through the output port.

2. The modular redundant power supply of claim 1, wherein the duty power is 12V, and the auxiliary duty power is 5V or 3.3V.

3. The modular redundant power supply of claim 1, wherein the power regulation unit regulates a plurality of the auxiliary duty power each having a different voltage.

4. The modular redundant power supply of claim 1, wherein the power integration panel gets a start control signal from the external device, the power regulation module including a start control unit to get the start control signal from the power integrated panel to control a start of each of the power supply modules.

5. The modular redundant power supply of claim 1, wherein the casing includes a plurality of installation racks including the installation rack located in the installation space in a spaced manner to hold the power supply modules in a removable fashion.

6. The modular redundant power supply of claim 1, wherein each of the power supply modules includes the power input end, a rectification filter unit connected to the power input end, a power factor correction unit connected to the rectification filter unit, a transformer connected to the power factor correction unit, a pulse width control unit, a switch element and the power output end connectable to the first connection ports.

7. The modular redundant power supply of claim 6, wherein each of the power supply modules further includes a secondary rectification filter unit connected to an output side of the transformer.

* * * * *